(12) United States Patent
Shinjo et al.

(10) Patent No.: US 8,940,373 B2
(45) Date of Patent: Jan. 27, 2015

(54) LIQUID COMPOSITION, INK JET RECORDING METHOD, INK JET RECORDING APPARATUS AND RECORDED IMAGE

(71) Applicant: Canon Kabushiki Kaisha, Tokyo (JP)

(72) Inventors: Kenji Shinjo, Yokohama (JP); Shinsuke Tsuji, Kawasaki (JP); Kouji Harada, Kawasaki (JP); Yutaka Kurabayashi, Higashimurayama (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 13/793,671

(22) Filed: Mar. 11, 2013

(65) Prior Publication Data

US 2013/0187999 A1   Jul. 25, 2013

Related U.S. Application Data

(62) Division of application No. 12/877,998, filed on Sep. 8, 2010, now abandoned.

(30) Foreign Application Priority Data

Oct. 30, 2009   (JP) ................................. 2009-250939

(51) Int. Cl.
*G03F 7/027* (2006.01)
*C09D 11/30* (2014.01)
*G03F 7/029* (2006.01)
*B41J 2/01* (2006.01)
*G03F 7/004* (2006.01)

(52) U.S. Cl.
CPC . *C09D 11/30* (2013.01); *B41J 2/01* (2013.01); *G03F 7/0048* (2013.01); *G03F 7/027* (2013.01); *G03F 7/029* (2013.01)
USPC ................ 427/511; 524/457; 522/71; 522/74

(58) Field of Classification Search
CPC ....... G03F 7/0048; G03F 7/027; G03F 7/029; C09D 11/30; B41J 2/01
USPC .......................... 427/511; 524/457; 522/71, 74
See application file for complete search history.

(56) References Cited

U.S. PATENT DOCUMENTS

| | | | |
|---|---|---|---|
| 5,789,619 A | 8/1998 | Aizawa et al. | |
| 5,892,115 A | 4/1999 | Aizawa et al. | |
| 6,072,084 A | 6/2000 | Aizawa et al. | |
| 6,428,862 B1 * | 8/2002 | Noguchi | 427/511 |
| 6,608,119 B2 | 8/2003 | Tanabe et al. | |
| 2001/0047044 A1 | 11/2001 | Tanabe et al. | |

FOREIGN PATENT DOCUMENTS

| | | | |
|---|---|---|---|
| JP | 8-081428 A | | 3/1996 |
| JP | 9-208609 A | | 8/1997 |
| JP | 09208609 A | * | 8/1997 |
| JP | 2002-167369 A | | 6/2002 |
| JP | 2005-307199 A | | 11/2005 |
| JP | 2007-119449 A | | 5/2007 |
| WO | 01/57145 A1 | | 8/2001 |

OTHER PUBLICATIONS

Traslation to JP 09208609 (Aug. 12, 1997).*
R.L. Feller, Polymer Emulsions, International Institute for Conservation of Historic and Artistic Works, vol. 6, No. 2 (May 1966), pp. 24-28.

* cited by examiner

*Primary Examiner* — Kelechi Egwim
(74) *Attorney, Agent, or Firm* — Fitzpatrick, Cella, Harper & Scinto

(57) ABSTRACT

The invention provides an aqueous liquid composition containing a water-soluble monomer, a photopolymerization initiator and an aqueous medium and further containing a polymer emulsion, wherein the water-soluble monomer is a monomer that has two or more ethylenically unsaturated bonds and is curable with an active energy ray.

10 Claims, No Drawings

LIQUID COMPOSITION, INK JET RECORDING METHOD, INK JET RECORDING APPARATUS AND RECORDED IMAGE

This application is a division of application Ser. No. 12/887,998 filed Sep. 22, 2010.

BACKGROUND OF THE INVENTION

1. Field of the Invention

The present invention relates to a liquid composition, an ink jet recording method, ink jet recording apparatus and a recorded image.

2. Description of the Related Art

An ink jet recorded image, in particular, a recorded image formed with an aqueous ink involves a problem on fastness properties such as water fastness and scratch resistance. As measures to solve this problem, it has been known in recent years to use an ink jet ink containing an emulsion.

On the other hand, as a technique for forming a fast image, is mentioned a technique of using an aqueous liquid composition containing a water-insoluble polymer present in a state of an emulsion. When the water-insoluble polymer present in the state of the emulsion in the liquid composition (hereinafter also referred to as a polymer emulsion) is applied to a recording medium, the polymer emulsion aggregates to form a film as the water around the emulsion decreases. The film formed can protect an image formed on the recording medium to improve the fastness of the image.

However, the above-described technique has caused the following problems in some cases. The polymer held in the state of the emulsion in an aqueous medium has caused in some cases destruction of the emulsion structure due to storage under a severe environment (high temperature, vibration), long-term storage or an influence by the pH of a coloring material upon addition of the coloring material into the liquid composition to cause deposition of polymer components. When the liquid composition containing the polymer emulsion has been applied to a recording medium, in some cases, the filming (aggregation) of the polymer emulsion has rapidly progressed to make the film formed uneven, and consequently the quality of the resulting image has become insufficient, and the fastness has not been sufficiently improved.

In order to solve this problem, in an aqueous ink using an emulsion, it is known to add an aid for inhibiting the rapid progress of filming of the emulsion to improve the uniformity of a film formed by the emulsion. As such aids are generally used plasticizers and high-boiling alcoholic solvents. However, such an aid is liable to remain in a film formed, and consequently the fastness of the film may not be improved in some cases. On the other hand, in recent years, there has been a dramatically strong demand for diversity to meet individual needs of customers and necessity for high image quality in an image forming technique.

Specific techniques for forming an image with a liquid composition containing an emulsion include a technique described in WO01/057145. WO01/057145 describes a technique for improving the fastness of an image with a liquid composition containing acroylmorpholine.

SUMMARY OF THE INVENTION

However, the above-described prior art has involved the following problem. Specifically, according to the investigation by the present inventors, the stability of the liquid composition, and the uniformity and strength of a film have not been sufficiently achieved according to the technique disclosed in WO01/057145 in some cases.

Accordingly, it is an object of the present invention to provide an aqueous liquid composition curable by irradiation of active energy rays, also suitably usable as an ink containing a coloring material, excellent in stability, and capable of forming a uniform film and imparting high fastness to an image. Another object of the present invention is to provide an ink jet recording method and an ink jet recording apparatus using the liquid composition, and a recorded image.

The above objects are achieved by the present invention described below. According to the present invention, there is thus provided an aqueous liquid composition comprising a water-soluble monomer, a photopolymerization initiator and an aqueous medium and further comprising a polymer emulsion, wherein the water-soluble monomer is a monomer that has two or more ethylenically unsaturated bonds and is curable with an active energy ray. According to the present invention, there are also provided an ink jet recording method and an ink jet recording apparatus using the liquid composition, and a recorded image formed by the ink jet recording method.

According to the present invention, there is provided an aqueous liquid composition curable by irradiation of active energy rays, also suitably usable as an ink containing a coloring material, excellent in stability, and capable of forming a uniform film and imparting high fastness to an image. According to the present invention, there are also provided an ink jet recording method and an ink jet recording apparatus using the liquid composition, and a recorded image.

Further features of the present invention will become apparent from the following description of exemplary embodiments.

DESCRIPTION OF THE EMBODIMENTS

The present invention will hereinafter be described in detail by preferred embodiments. The present inventors have carried out investigations. As a result, it has been found that an aqueous liquid composition containing a polymer emulsion and a water-soluble monomer that has two or more ethylenically unsaturated bonds and is curable with an active energy ray is excellent in the following respects, thus leading to completion of the present invention. More specifically, the liquid composition can form a uniform film on an image obtained by irradiation of active energy rays, is excellent in fastness such as the crosslinking degree of a cured product of the water-soluble monomer and adhesion between the cured product and a film formed by the polymer emulsion and also satisfies the level of low viscosity required in ink jet recording applications. In addition, the liquid composition is excellent in long-term storage stability and ejection stability (also referred to as stability merely) required in aqueous liquid compositions in particular.

The reason why the liquid composition according to the present invention, which contains the above-described specific water-soluble monomer, can form a uniform film and achieves excellent results in curing performance and stability is not clearly known. However, the present inventors speculate as follows. First, the mechanism with which the uniform film can be formed by using the liquid composition according to the present invention is presumed to be as follows. The monomer used in the present invention has a hydroxyl group or an ethylene oxide group and thus exhibits specific water-solubility (hydrophilicity). Accordingly, the water-soluble monomer can hold water in the liquid composition like a high-boiling alcoholic solvent. In addition, the water-soluble monomer can gradually release the water held upon formation of a film formed by the polymer emulsion, so that it is supposed that the monomer can function as an ideal aid agent to inhibit the rapid aggregation of the polymer emulsion so as to gradually form a film.

Then, the mechanism with which the curing performance of the liquid composition according to the present invention is improved is presumed to be as follows. The water-soluble monomer used in the present invention is cured in a film formed by the emulsion upon irradiation of active energy rays unlike a conventional aid agent liable to remain in a liquid state in the film, so that the fastness of the film obtained from the emulsion can be improved. In other words, the water-soluble monomer can form the film together with the polymer emulsion, so that an extremely fast film can be formed compared with the case where the water-soluble monomer alone or the polymer emulsion alone is used.

The action and effect in aqueous ink jet recording that is a principal application example of the liquid composition according to the present invention will hereinafter be described. Incidentally, as the active energy ray used in the present invention, may be used ultraviolet rays or electron rays. Description is given below taking a liquid composition of such a type that radical polymerization take place by ultraviolet rays to be cured, as a typical example. However, the application range of the present invention is not limited by this example at all.

The liquid composition according to the present invention can exhibit a particularly marked effect on a recording medium which has liquid absorbability but is hard to improve the color of a pigment and scratch resistance, such as plain paper. However, in the present invention, a recording medium with low liquid absorbability of the aqueous liquid composition or a non-absorbent recording medium made of a metal or plastic may also be used.

The respective components of the active energy ray curable liquid composition according to the present invention, which has such excellent action and effect as described above, will now be described.

Polymer Emulsion

The liquid composition according to the present invention contains a polymer emulsion. In the present invention, the polymer emulsion means a water-insoluble polymer present in a state of an emulsion in the liquid composition. Incidentally, the water-insoluble polymer means a polymer having a solubility of 1% by mass or less in water under normal conditions (ordinary temperature, ordinary pressure, ordinary humidity). The polymer emulsion used in the present invention is favorably made up by a thermoplastic resin capable of forming a film. The weight average molecular weight (Mw) of the polymer is favorably within a range of 5,000 or more and 10,000 or less.

No particular limitation is imposed on a monomer usable for obtaining the polymer emulsion according to the present invention. However, the following monomer may be suitably used. Specific examples thereof include styrene, acrylic esters such as methyl acrylate and ethyl acrylate, vinyl chloride, vinyl acetate, acrylic acid, and methacrylic acid.

The average particle size of the polymer emulsion is favorably within a range of 0.01 μm or more and 2 μm or more. In the present invention, the average particle size of the polymer emulsion can be determined by measuring its d50 particle diameter that is a median diameter by means of a laser light scattering type particle size measuring apparatus.

The polymer making up the polymer emulsion is favorably a polymer of a structure having a plurality of groups polymerizable by irradiation of active energy rays. As the polymer emulsion according to the present invention, may also be used a commercially available polymer emulsion. Examples of the commercially available polymer emulsion include VINY-BLAN 277 (emulsion of a vinyl chloride-acrylic ester copolymer, available from Nisshin Chemical Industries Co., Ltd.), JONCRYL 537J (emulsion of a styrene-acrylic acid copolymer, available from BASF Japan Ltd.) and UCECOAT 7655 (polymer emulsion having a plurality of groups polymerizable by irradiation of active energy rays, available from DAICEL-CYTEC COMPANY LTD.).

The polymer emulsion used in the present invention is favorably contained in a content range of 1.0% by mass or more and 40.0% by mass or less based on the total mass of the liquid composition.

Water-Soluble Monomer

The monomer used in the present invention is water-soluble. The water-solubility in the water-soluble monomer means that the monomer is dissolved in water in an amount of 5% by mass or more under normal conditions (ordinary temperature, ordinary pressure, ordinary humidity). Accordingly, the water-solubility in the present invention means the so-called hydrophilicity. When a monomer exhibits the hydrophilicity of this extent, it can be present stably in the aqueous liquid composition.

In the present invention, as the monomer exhibiting the water-solubility, is favorably used a monomer having one or more hydroxyl groups. Although the detailed reason is not known, a firmer film can be formed compared with a case where a monomer achieving the water-solubility by another group alone than the hydroxyl group, such as a monomer having an ethylene oxide group, is used when the monomer achieving the water-solubility by the hydroxyl group is used, so that higher fastness can be imparted to the resulting image.

The water-soluble monomer used in the present invention is a monomer having two or more ethylenically unsaturated bonds in its structure and curable with active energy rays. Examples of the monomer having ethylenically unsaturated bonds and curable with active energy rays include monomers having functional groups such as a (meth)acryl group and a (meth)acrylamide group. The water-soluble monomer according to the present invention has two or more ethylenically unsaturated bonds and thus has two or more such functional groups as described above. The liquid composition according to the present invention contains the above-described specific water-soluble monomer and may further contain any other monomer than this monomer.

In addition, the water-soluble monomer used in the present invention favorably has a molecular structure satisfying the relationship of the following expression (1)

$$3.5 \leq (\text{Molecular weight of water-soluble monomer})/(28.05 \times (\text{Number of unsaturated double bonds in molecular structure})) \leq 8.0. \quad \text{Expression (1)}$$

The expression (1) means the proportion of molecules making up the ethylenically unsaturated bonds in the water-soluble monomer. In general, since a group making up an ethylenically unsaturated bond means $CR_1R_2=CR_3R_4$ ($R_1$ to $R_4$ being arbitrary groups), it is difficult to calculate the total molecular weight of molecules contributing to the ethylenically unsaturated bond without considering the molecular structure of each monomer. Thus, in the present invention, the lowest molecular weight of the groups making up the ethylenically unsaturated bond, i.e., the molecular weight (28.05) of ethylene, in which $R_1$ to $R_4$ are all H, was used to calculate the proportion of molecules considered to substantially contribute to the ethylenically unsaturated bonds in the water-soluble monomer. According to the investigation by the present inventors, the water-soluble monomer satisfies the relationship of the expression (1), whereby the strength of the film cured can be strengthened.

The water-soluble monomer according to the present invention may further have any other functional group than the hydroxyl group, the ethylene oxide group and the group having the unsaturated double bond in its structure. Specific examples of such a functional group include a carboxyl group, a sulfonic group, a phosphoric group, an amino group and salts thereof, an amide group, an amide linkage group, an ester linkage group, and a sulfone linkage group.

The molecular weight of the water-soluble monomer according to the present invention is favorably within a range of 200 or more and 2,000 or less. As described above, the water-soluble monomer according to the present invention is dissolved in water in an amount of 5% by mass or more, and is more favorably dissolved in an amount of 20% by mass or more.

As described above, it is satisfactory for the water-soluble monomer used in the present invention to have 2 or more ethylenically unsaturated bonds. Since a faster film can be formed as the number of the ethylenically unsaturated bonds increases, no particular limitation is imposed on the upper limit of the number thereof. However, since there is a tendency for the viscosity of the liquid composition to increase as the number of the ethylenically unsaturated bonds in the water-soluble monomer increases, the number of the ethylenically unsaturated bonds is favorably 2 to 6. The number of the ethylenically unsaturated bonds in the water-soluble monomer is more favorably 3 or 4.

Exemplified Compounds 1 to 9 that are particularly favorable specific examples of the water-soluble monomer used in the present invention are shown below. Needless to say, the scope of the present invention is not limited thereto.

SPECIFIC EXAMPLES OF WATER-SOLUBLE MONOMER

Exemplified Compound 1

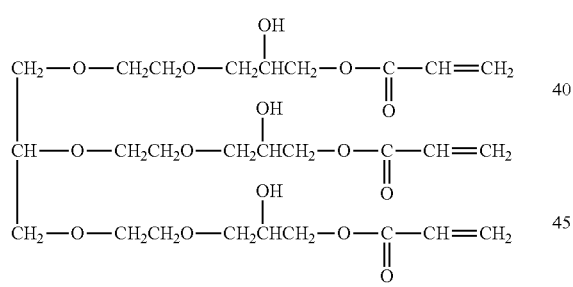

Exemplified Compound 2

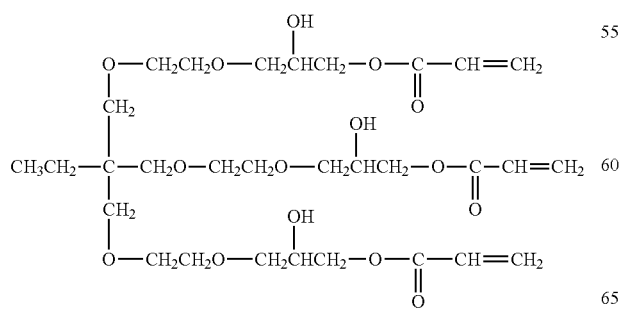

Exemplified Compound 3

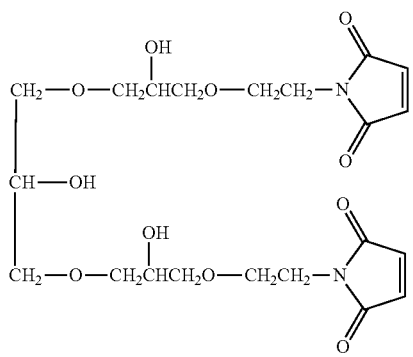

Exemplified Compound 4

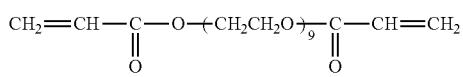

Exemplified Compound 5 NK ESTER A-400, Product of Shin-Nakamura Chemical Co., Ltd $$CH_2{=}CH{-}\underset{\underset{O}{\|}}{C}{-}O{-}(CH_2CH_2O)_9{-}\underset{\underset{O}{\|}}{C}{-}CH{=}CH_2$$

Exemplified Compound 6

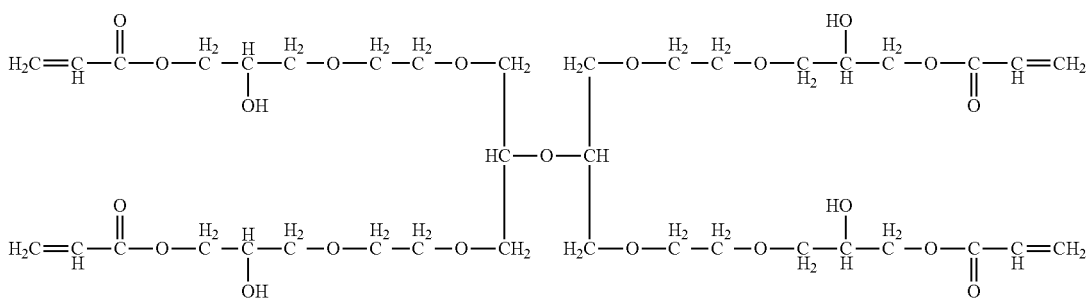 [SMILES: C=CC(=O)OCC(O)COCCOCC(COCCOCC(O)COC(=O)C=C)OC(COCCOCC(O)COC(=O)C=C)COCCOCC(O)COC(=O)C=C]

Exemplified Compound 7 Glycerol Diacrylate

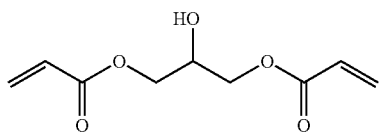

Exemplified Compound 8

N,N'-(oxybismethylene)bisacrylamide

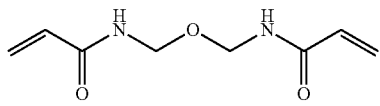

Exemplified Compound 9 NK OLIGO EA5521

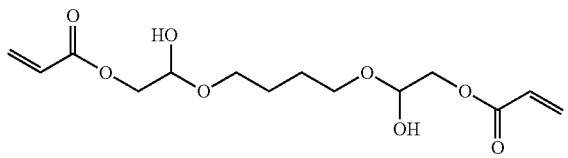 [SMILES: C=CC(=O)OCC(O)OCCCCOC(O)COC(=O)C=C]

A synthesis process for the water-soluble monomer used in the present invention is not limited at all, and any conventionally known process may be used. As an example, the synthesis process of an amide compound as described above is described in, for example, Japanese Patent Application Laid-Open No. 2007-119449. The synthetic process of an N-vinylamide compound as described above is described in, for example, Japanese Patent Application Laid-Open Nos. H08-81428 and 2002-167369. In addition to the exemplified compounds the structures of which have been shown above and the amide compounds the synthesis processes of which have been shown, commercially available compounds may also be used.

In the present invention, the content of the water-soluble monomer in the liquid composition is favorably 1.0% by mass or more and 40.0% by mass or less based on the total mass of the liquid composition. The mass ratio between the polymer

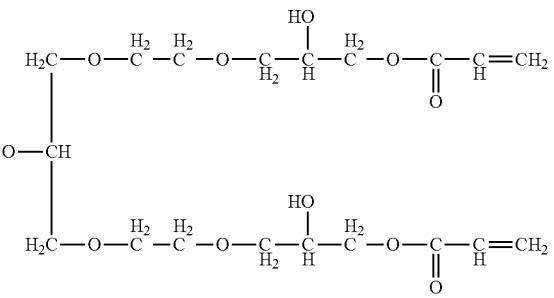

emulsion and the water-soluble monomer, which are used in combination in the liquid composition in the present invention, is favorably within a range of from 5:1 to 1:10. When the mass ratio is controlled within this range, both of the glossiness of the film and the fastness of the film can be achieved extremely suitably.

Photopolymerization Initiator

The photopolymerization initiator used in the present invention is favorably a hydrophilic photopolymerization initiator and is also favorably a compound which generates a radical by active energy rays. The photopolymerization initiator is further favorably an initiator generating a radical upon using ultraviolet rays as the active energy rays. Specific examples of the hydrophilic photopolymerization initiator satisfying these favorable conditions include compounds represented by the following general formulae (1) to (5).

General Formula (1)

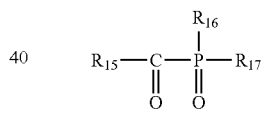

In the general formula (1), $R_{15}$ is an alkyl group having 1 to 5 carbon atoms or a phenyl group, with the proviso that the phenyl group may be unsubstituted or mono- to tetra-substituted by any substituent selected from halogen atoms, alkyl groups having 1 to 5 carbon atoms, alkyloxy groups having 1 to 5 carbon atoms, a sulfonic group, a carboxyl group, a hydroxyl group and salts thereof; $-SO_3^-M^+$, $-CO_2^-M^+$, $-O^-M^+$, and the following atomic group (E), $R_{16}$ is an alkyloxy group having 1 to 5 carbon atoms or a phenyl group, with the proviso that the phenyl group may be unsubstituted or mono- to tetra-substituted by any substituent selected from halogen atoms, alkyl groups having 1 to 5 carbon atoms and alkyloxy groups having 1 to 5 carbon atoms, and $R_{17}$ is the following atomic group (E).

Atomic Group (E)

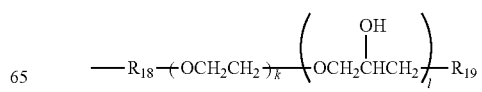

In the atomic group (E), $R_{18}$ is —$[CH_2]_{x2}$— ($x_2$ being 0 or 1) or an unsubstituted or substituted phenylene group, $R_{19}$ is a hydrogen atom, or a sulfonic group, a carboxyl group, a hydroxyl group or a salt thereof; or —$SO_3^-M^+$, —$CO_2^-M^+$ or —$O^-M^+$, k is an integer of 0 to 10, and 1 is 0 or 1. In the general formula (1) and the atomic group (E), $M^+$ ions are, independently of one another, a hydrogen ion, alkali metal ion or alkaline earth metal ion, or an ammonium ion represented by $HNR_{20}R_{21}R_{22}$ ($R_{20}$, $R_{21}$ and $R_{22}$ being, independently of one another, a hydrogen atom, an alkyl group having 1 to 5 carbon atoms, a monohydroxyl-substituted alkyl group having 1 to 5 carbon atoms or a monohydroxyl-substituted phenyl group).

General Formula (2)

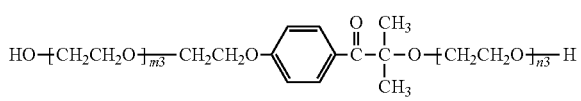

In the general formula (2), m3 is an integer of 1 or more, n3 is an integer of 0 or more, and m3+n3 is an integer of 1 to 8.

General Formula (3)

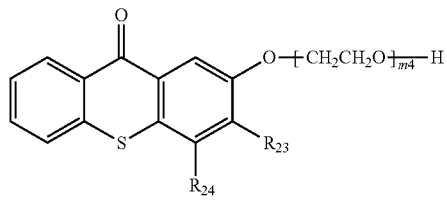

In the general formula (3), $R_{23}$ and $R_{24}$ are, independently of each other, a hydrogen atom or an alkyl group having 1 to 5 carbon atoms, and m4 is an integer of 5 to 10.

General Formula (4)

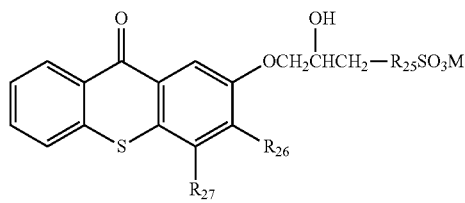

In the general formula (4), $R_{26}$ and $R_{27}$ are, independently of each other, a hydrogen atom or an alkyl group having 1 to 5 carbon atoms, $R_{25}$ is —$(CH_2)_x$— (x being 0 or 1), —O— ($CH_2)_y$— (y being 1 or 2) or a phenylene group, and M is a hydrogen atom or an alkali metal.

General Formula (5)

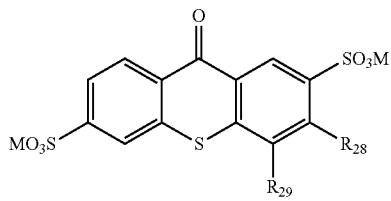

In the general formula (5), $R_{28}$ and $R_{29}$ are, independently of each other, a hydrogen atom or an alkyl group having 1 to 5 carbon atoms, and M is a hydrogen atom or an alkali metal.

In the general formula (1), the alkyl group or phenyl group of $R_{15}$ and the phenylene group of $R_{18}$ may have a substituent. Specific examples of such a substituent include halogen atoms, alkyl group having 1 to 5 carbon atoms, alkyloxy groups having 1 to 5 carbon atoms, groups represented by the atomic group (E), a sulfonic group, a carboxyl group, a hydroxyl group, and salts of the sulfonic, carboxyl and hydroxyl groups (—$SO_3M$, —$CO_2M$ and —OM). $R_{15}$ is particularly favorably a phenyl group having an alkyl group having 1 to 5 carbon atoms as a substituent. Ms are, independently of one another, a hydrogen atom, an alkali metal, an alkaline earth metal or an ammonium represented by $HNR_{30}R_{31}R_{32}$ ($R_{30}$, $R_{31}$ and $R_{32}$ being, independently of one another, a hydrogen atom, an alkyl group having 1 to 5 carbon atoms, a monohydroxyl-substituted alkyl group having 1 to 5 carbon atoms or a monohydroxyl-substituted phenyl group).

Examples of the salt of $R_{15}$ in the general formula (1) include —$SO_3M$, —$CO_2M$ and —OM. The Ms are, independently of one another, a hydrogen atom, an alkali metal, an alkaline earth metal or an ammonium represented by $HNR_{33}R_{34}R_{35}$ ($R_{33}$, $R_{34}$ and $R_{35}$ being, independently of one another, a hydrogen atom, an alkyl group having 1 to 5 carbon atoms, a monohydroxyl-substituted alkyl group having 1 to 5 carbon atoms or a monohydroxyl-substituted phenyl group).

The alkyloxy group or phenyl group of $R_{16}$ in the general formula (1) may have a substituent, and examples of the substituent include halogen atoms, alkyl groups having 1 to 5 carbon atoms and alkyloxy groups having 1 to 5 carbon atoms. $R_{16}$ is particularly favorably an alkyloxy group, and —$OC_2H_5$ or —$OC(CH_3)_3$ is favorable.

The alkyl groups of $R_{23}$, $R_{24}$, and $R_{26}$ to $R_{29}$ in the general formulae (3) to (5) may have a substituent. Specific examples of such a substituent include halogen atoms, a sulfonic group, a carboxyl group, a hydroxyl group and salts of the sulfonic, carboxyl and hydroxyl groups (—$SO_3M$, —$CO_2M$ and —OM). The Ms are, independently of one another, a hydrogen atom, an alkali metal, an alkaline earth metal or an ammonium represented by $HNR_{36}R_{37}R_{38}$ ($R_{36}$, $R_{37}$ and $R_{38}$ being, independently of one another, a hydrogen atom, an alkyl group having 1 to 5 carbon atoms, a monohydroxyl-substituted alkyl group having 1 to 5 carbon atoms or a monohydroxyl-substituted phenyl group).

Among these compounds, a water-soluble acyl-phosphine oxide represented by the general formula (1) is favorable. More specifically, the following Exemplified Compound A is favorably used as the photopolymerization initiator. As a synthetic process for the following Exemplified Compound A, may be suitably used the process described in Japanese Patent Application Laid-Open No. 2005-307199.

Exemplified Compound A

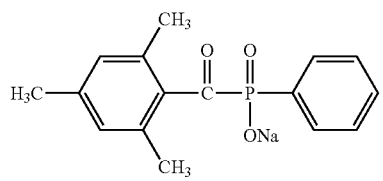

When a thioxanthone type hydrophilic photopolymerization initiator is used as the hydrophilic photopolymerization initiator in the present invention, a hydrogen donor is favorably added. Example of the hydrogen donor usable in the present invention include triethanolamine and monoethanolamine.

In the present invention, 2 or more photopolymerization initiators may be used in combination. The use of 2 or more photopolymerization initiators can expect that light having a wavelength which cannot be effectively utilized with one photopolymerization initiator is used to more accelerate the generation of the radical so as to improve the curing characteristics.

Aqueous Medium

The liquid composition according to the present invention contains an aqueous medium. In the present invention, water is favorably used as the aqueous medium. A mixed solvent of water and a water-soluble organic solvent is more favorably used as the aqueous medium. The water-soluble organic solvent is particularly favorably one that is water-soluble and can satisfy ink jet characteristics such as ejection stability, and all conventionally known organic solvent may be applied. However, the mixed solvent contains water in an amount of favorably 50% by mass or more, more favorably 90% by mass or more, based on the total mass of the mixed solvent from the viewpoints of influence on the environment and odor upon work.

Examples of water-soluble organic solvents usable in the present invention include glycol ethers such as ethylene glycol monomethyl ether, ethylene glycol monoethyl ether, ethylene glycol monoisopropyl ether, ethylene glycol monoallyl ether, diethylene glycol monomethyl ether, diethylene glycol monoethyl ether, triethylene glycol monomethyl ether, triethylene glycol monoethyl ether, propylene glycol monomethyl ether and dipropylene glycol monomethyl ether; polyhydric alcohols such as glycerol, and water-soluble amide compounds such as 2-pyrrolidone. Since the water-soluble organic solvent, in particular, a highboiling-point water-soluble organic solvent, may be incorporated in a film formed in some cases to deteriorate the fastness of the resulting image as described above, the content of the water-soluble organic solvent is favorably less than 10.0% by mass based on the total mass of the liquid composition.

Liquid Composition Containing No Coloring Material

The active energy ray curable liquid composition according to the present invention may be used as being colorless without containing such a coloring material as described below. When the liquid composition is prepared so as to have ink jet recording characteristics, it can be provided as a transparent ink jet liquid composition of the active energy ray curing type. When such a liquid composition is used, a clear film can be obtained because the liquid composition contains no coloring material. Examples of uses of the liquid composition containing no coloring material include the following: an undercoat for imparting various suitabilities for image recording to a recording medium and an overcoat for the purpose of protecting the surface of an image formed with an ordinary ink and imparting decoration and gloss. In the liquid composition of this type, a colorless pigment or fine particles, which do not intend to provide coloring, may also be dispersed and contained according to uses such as prevention of oxidation and prevention of fading. The addition of them can improve various characteristics such as image quality, fastness and handling property of the resulting recorded article in either the undercoat or the overcoat.

When the transparent liquid composition applicable to the above uses is provided, the total amount of the polymer emulsion and water-soluble monomer is favorably 10.0% by mass or more and 70.0% by mass or less based on the total mass of the liquid composition. In addition, the photopolymerization initiator is favorably contained in an amount of 1.0 part by mass or more and 10.0 parts by mass or less per 100.0 parts by mass in total of the polymer emulsion and water-soluble monomer and in an amount of at least 0.5 parts by mass per 100.0 parts by mass of the liquid composition.

When the liquid composition according to the present invention is used in a form of containing no coloring material, a polymerizable low-viscosity monomer is favorably contained as a solvent therein. The advantage of the use of such a material, which is not an ordinary solvent, resides in that influence on solid physical properties is reduced because such a material does not remain as a plasticizer in the solid after the curing reaction by the active energy rays. Specific examples of the polymerizable low-viscosity monomer include acryloylmorpholine, acrylamide, methylenebisacrylamide, monoacrylates of monosaccharides, monoacrylates of oligoethylene oxides and monoacrylates of dibasic acids.

When the liquid composition according to the present invention is used in a form of containing no coloring material, it is favorable not to use an additive imparting moisturization as described below. The reason for it is that viscosity increase is small because a solid component such as a pigment is not contained, and some viscosity increase can be easily recovered if any. Needless to say, an additive having higher moisturization properties as described below may be added in a necessary and minimum amount. Various kinds of additives such as a surfactant may also be added. These may be selected from many compounds commonly used in aqueous ink jet liquids.

The case where the liquid composition according to the present invention is used in a state (as an ink) that a coloring material is contained will now be described. Such a liquid composition is hereinafter referred to as an ink.

Coloring Material or Pigment

The liquid composition according to the present invention may contain a coloring material such as a pigment in addition to the components described above. In this case, a pigment dispersion obtained by uniformly dispersing a pigment in an aqueous medium is favorably used as the coloring material. As the pigment dispersion, is favorably used a pigment dispersion obtained by stably dispersing a pigment in water by the action of an anionic group.

The average particle size of pigment particles is within a range of favorably 25 nm or more and 350 nm or less, more favorably 70 nm or more and 200 nm or less. When the average particle size of the pigment particles is controlled within the above favorable range, the pigment particles can be made sufficiently smaller than the wavelength of visible rays to obtain a clear recorded image with less light scattering.

Incidentally, the average particle size of the pigment particles can be determined by measuring its d50 particle diameter that is a median diameter by means of a laser light scattering type particle size measuring apparatus.

When a pigment is contained as the coloring material, the concentration of the pigment in the liquid composition is favorably 0.3% by mass or more and 10.0% by mass or less based on the total mass of the ink. When the concentration of the pigment is of the order of 0.3% by mass or more and 1.0% by mass or less, the concentration is within such a range that it is usable as a light-color ink though it varies according to the coloring power of the pigment and the dispersed state of the pigment particles. When the concentration is higher than the above range, a concentration used for a general color ink is given.

Coloring Material or Dye

In the ink according to the present invention, a conventionally known dye may be used as the coloring material without limiting it to a pigment as described above, and the ink can be provided as an ink containing a water-soluble dye in a dissolved state within such a range that no practical problem in fading caused by irradiation of active energy rays occurs. A coloring material dispersion containing a disperse dye or oil-soluble dye in a dispersed state may also be applied like the pigment dispersion. These dispersions may be suitably selected as necessary for the end application intended.

The favorable content of the dye in the ink is within a range of 0.1% by mass or more and 10.0% by mass or less based on the total mass of the ink. When the content of the dye is low, such an ink may be suitably applied to the so-called light-color ink.

Other Additives

When the liquid composition according to the present invention is used as an ink containing a coloring material, various additives such as water-soluble organic solvents and surfactants may be added into the ink. The additives are used for the purpose of inhibiting the volatility of the ink, lowering the viscosity of the ink and controlling wetting tendency with respect to a recording medium.

When the additives are added in an amount of 10.0% by mass or more into the ink, the additive themselves may be incorporated in the film in some cases. Therefore, it is favorable to use a recording medium having high liquid absorbability and conduct natural or forced drying after the ink is cured with the active energy rays for inhibiting the lowering of the film strength by the additives. Incidentally, the monomer in the ink according to the present invention is water-soluble, and thus has high affinity for water and certain moisturizability in itself. Therefore, the ink according to the present invention may not contain any additive according to the composition thereof.

When a non-liquid-absorbent recording medium is used as the recording medium, the recording medium cannot be expected to have the ability to absorb the additives. It is thus favorable to limit the amount of the additives to a minimum. Specifically, the content of the additives is favorably less than 10% by mass based on the total mass of the ink. The content is more favorably less than 5% by mass. When the above-described recording medium is used, no additive is favorably added to the ink if possible.

When the liquid composition according to the present invention is used as the ink containing the coloring material, examples of the additives suitably used include such various glycol ethers and polyhydric alcohols such as glycerol as mentioned above as the water-soluble organic solvents usable in the present invention.

When the liquid composition according to the present invention is used as the ink containing the coloring material, the content of the aqueous medium, the content of the photopolymerization initiator and the total amount of the polymer emulsion and water-soluble monomer are favorably adjusted according to the absorption property of the coloring material. Specifically, the content of the aqueous medium is favorably 40.0% by mass or more and 90.0% by mass or less, more favorably 60.0% by mass or more and 75.0% by mass or less, based on the total mass of the liquid composition. The total amount of the polymer emulsion and water-soluble monomer in the liquid composition is favorably 1.0% by mass or more and 35.0% by mass or less, more favorably 10.0% by mass or more and 25.0% by mass or less, based on the total mass of the liquid composition. The content of the photopolymerization initiator is favorably 0.1% by mass or more and 7.0% by mass or less, more favorably 0.3% by mass or more and 5.0% by mass or less, based on the total mass of the liquid composition though it varies according to the total amount of the polymer emulsion and the water-soluble monomer.

Ink Jet Recording Apparatus

In the present invention, an ink jet recording apparatus equipped with a unit for applying the liquid composition to a recording medium and a unit for irradiating the liquid composition applied to the recording medium with active energy rays may be favorably used. In the present invention, an apparatus in which an UV lamp is arranged on a front side of a paper discharge section, paper feeding and discharging are conducted by winding a paper sheet on a roll, or a drying section is separately provided may be suitably selected as the ink jet recording apparatus.

In the present invention, an ultraviolet irradiation apparatus is favorably used as an active energy ray irradiation unit. The ultraviolet irradiation apparatus is favorably a mercury lamp with a vapor pressure of 1 Pa or more and 10 Pa or less during lighting. Since the emission spectrum in an ultraviolet region of the mercury lamp is within a range of 450 nm or less, in particular, 184 nm or more and 450 nm or less, the mercury lamp is suitable for efficiently reacting the polymer emulsion and water-soluble monomer contained in the liquid composition. Specifically, as the mercury lamp, may be suitably used a metal halide lamp, high pressure mercury lamp, extra-high pressure mercury lamp, xenon flash lamp, deep UV lamp, electrodeless UV lamp using microwaves or UV laser.

An ultraviolet irradiation apparatus using UV-LED of a light emitting diode system or an UV excimer lamp may also be suitably used. The ultraviolet irradiation intensity of the ultraviolet irradiation apparatus such as the ultraviolet irradiation apparatus using UV-LED of the light emitting diode system or the UV excimer lamp is favorably 500 mW/cm$^2$ or more and 5,000 mW/m$^2$ or less from the viewpoint of polymerization rate. If the ultraviolet irradiation intensity is insufficient, the strength of the resulting film may not be sufficiently achieved in some cases. If the irradiation intensity is too strong, a recording medium may be damaged, or the fading of a coloring material may occur in some cases.

The ink jet recording method according to the present invention has an ejection step of ejecting the liquid composition on a recording medium and a curing step of irradiating the recording medium on which the liquid composition has been applied with active energy rays to cure the water-soluble monomer. The above-described ink jet recording apparatus is favorably used for performing the ink jet recording method according to the present invention.

EXAMPLES

The present invention will hereinafter be described more specifically by the following Examples and Comparative Examples. However, the present invention is not limited by these examples unless going beyond the gist of the present invention.

Examples 1 to 18 and Comparative Examples 1 to 9

The respective components shown in Tables 1-1 to 1-5 were mixed and thoroughly stirred. The resultant mixtures were then filtered under pressure through a filter having a pore size of 5 μm, thereby preparing active energy ray curable aqueous liquid compositions according to Examples 1 to 18 and Comparative Examples 1 to 9. The structures of Exemplified Compounds 1, 5 to 9, and A used in the liquid compositions of Examples in the Tables are as described above. The structures of comparative compounds in Table 1 are as described below. Incidentally, water was added in such an amount that the total amount of each liquid composition amounts to 100% by mass. Exemplified Compounds 1 and 5 to 9 are water-soluble monomers having 2 or more ethylenically unsaturated bonds. With respect to these compounds, the value of the expression (1) is shown in the parentheses.

TABLE 1-1

Composition of liquid composition (unit: % by mass)

| | | Example | | | | | |
|---|---|---|---|---|---|---|---|
| | | 1 | 2 | 3 | 4 | 5 | 6 |
| Coloring material (solid content) | Pigment dispersion (*1) | | | | 3.0 | 3.0 | 3.0 |
| Polymer emulsion (solid content) | VINYBLAN 277 (*2) | 10.0 | | | 10.0 | | |
| | UCECOAT 7655 (*3) | | 10.0 | 10.0 | | 10.0 | 10.0 |
| Water-soluble polyfunctional monomer | Exemplified Compound 1 (7.2) | 10.0 | 10.0 | | 10.0 | 10.0 | |
| | Exemplified Compound 5 (9.3) | | | 10.0 | | | 10.0 |
| | Comparative Compound 1 | | | | | | |
| | Comparative Compound 2 | | | | | | |
| Polymerization initiator | Exemplified Compound A | 1.0 | 1.0 | 1.0 | 2.0 | 2.0 | 2.0 |
| Surfactant | SN Wet 125 (*4) | 0.1 | 0.1 | 0.1 | 0.1 | 0.1 | 0.1 |
| Water-soluble organic solvent | Glycerol | | | | | | |
| Water | | Bal. | Bal. | Bal. | Bal. | Bal. | Bal. |

TABLE 1-2

Composition of liquid composition (unit: % by mass)

| | | Example | | | | | |
|---|---|---|---|---|---|---|---|
| | | 7 | 8 | 9 | 10 | 11 | 12 |
| Coloring material (solid content) | Pigment dispersion (*1) | | | | | | |
| Polymer emulsion (solid content) | VINYBLAN 277 (*2) | 10.0 | 10.0 | 10.0 | 10.0 | 16.7 | 17.1 |
| | UCECOAT 7655 (*3) | | | | | | |
| Water-soluble polyfunctional monomer | JONCRYL 537J (*5) | | | | | | |
| | Exemplified Compound 1 (7.2) | | | | | 3.3 | 2.9 |
| | Exemplified Compound 5 (9.3) | | | | | | |
| | Exemplified Compound 6 (7.61) | 10.0 | | | | | |
| | Exemplified Compound 7 (3.57) | | 10.0 | | | | |
| | Exemplified Compound 8 (3.28) | | | 10.0 | | | |
| | Exemplified Compound 9 (5.67) | | | | 10.0 | | |
| | Comparative Compound 1 | | | | | | |
| | Comparative Compound 2 | | | | | | |
| Polymerization initiator | Exemplified Compound A | 1.0 | 1.0 | 1.0 | 1.0 | 1.0 | 1.0 |
| Surfactant | SN Wet 125 (*4) | 0.1 | 0.1 | 0.1 | 0.1 | 0.1 | 0.1 |
| Water-soluble organic solvent | Glycerol | | | | | | |
| Water | | Bal. | Bal. | Bal. | Bal. | Bal. | Bal. |

TABLE 1-3

Composition of liquid composition (unit: % by mass)

| | | Example | | | | | |
|---|---|---|---|---|---|---|---|
| | | 13 | 14 | 15 | 16 | 17 | 18 |
| Coloring material (solid content) | Pigment dispersion (*1) | | | | | | |
| Polymer emulsion (solid content) | VINYBLAN 277 (*2) | 1.8 | 1.5 | 15.0 | 2.5 | 5.0 | |
| | UCECOAT 7655 (*3) | | | | | | |
| Water-soluble polyfunctional monomer | JONCRYL 537J (*5) | | | | | | 10.0 |
| | Exemplified Compound 1 (7.2) | 18.2 | 18.5 | 5.0 | 17.5 | 15.0 | 10.0 |
| | Exemplified Compound 5 (9.3) | | | | | | |
| | Exemplified Compound 6 (7.61) | | | | | | |
| | Exemplified Compound 7 (3.57) | | | | | | |
| | Exemplified Compound 8 (3.28) | | | | | | |
| | Exemplified Compound 9 (5.67) | | | | | | |
| | Comparative Compound 1 | | | | | | |
| | Comparative Compound 2 | | | | | | |
| Polymerization initiator | Exemplified Compound A | 1.0 | 1.0 | 1.0 | 1.0 | 1.0 | 1.0 |
| Surfactant | SN Wet 125 (*4) | 0.1 | 0.1 | 0.1 | 0.1 | 0.1 | 0.1 |
| Water-soluble organic solvent | Glycerol | | | | | | |
| Water | | Bal. | Bal. | Bal. | Bal. | Bal. | Bal. |

TABLE 1-4

Composition of liquid composition (unit: % by mass)

| | | Comparative Example | | | | | |
|---|---|---|---|---|---|---|---|
| | | 1 | 2 | 3 | 4 | 5 | 6 |
| Coloring material (solid content) | Pigment dispersion (*1) | | | | | 3.0 | 3.0 |
| Polymer emulsion (solid content) | VINYBLAN 277 (*2) | 10.0 | | | 10.0 | 10.0 | |
| | UCECOAT 7655 (*3) | | 10.0 | 10.0 | | | 10.0 |
| Water-soluble polyfunctional monomer | Exemplified Compound 1 (7.2) | | | | | | |
| | Exemplified Compound 5 (9.3) | | | | | | |
| | Comparative Compound 1 | 10.0 | | | | 10.0 | |
| | Comparative Compound 2 | | 10.0 | | | | 10.0 |
| Polymerization initiator | Exemplified Compound A | 1.0 | 1.0 | 1.0 | | 2.0 | 2.0 |
| Surfactant | SN Wet 125 (*4) | 0.1 | 0.1 | 0.1 | | 0.1 | 0.1 |
| Water-soluble organic solvent | Glycerol | | | | 10.0 | | |
| Water | | Bal. | Bal. | Bal. | Bal. | Bal. | Bal. |

TABLE 1-5

Composition of liquid composition
(unit: % by mass)

| | | Comparative Example | | |
|---|---|---|---|---|
| | | 7 | 8 | 9 |
| Coloring material (solid content) | Pigment dispersion (*1) | 3.0 | 3.0 | |
| Polymer emulsion (solid content) | VINYBLAN 277 (*2) | | 10.0 | |
| | UCECOAT 7655 (*3) | 10.0 | | |
| Water-soluble polyfunctional monomer | Exemplified Compound 1 (7.2) | | | |
| | Exemplified Compound 5 (9.3) | | | 10.0 |
| | Comparative Compound 1 | | | |
| | Comparative Compound 2 | | | |
| Polymerization initiator | Exemplified Compound A | 2.0 | | 1.0 |
| Surfactant | SN Wet 125 (*4) | 0.1 | | 0.1 |
| Water-soluble organic solvent | Glycerol | | 10.0 | |
| Water | | Bal. | Bal. | Bal. |

(*1) The pigment dispersion was prepared in the following manner and used in such a manner that the solid content thereof is the value shown in Tables 1-1 to 1-5. C.I. Pigment Blue 15:3 was used as a pigment, and a styrene-acrylic acid/ethyl acrylate random copolymer (weight average molecular weight: 3,500, acid value: 150 mg KOH/g) was used as a dispersant. These materials were dispersed by a bead mill to finally obtain a cyan pigment dispersion having a pigment solid content of 10% by mass and a mass ratio of the pigment and the resin (P/B) of 3:1. The average particle size of the pigment used was 120 nm. The average particle size of the pigment was determined by measuring its d50 particle diameter that is a median diameter by means of Nanotrac 150 (manufactured by Microtrac Inc.) that is a laser light scattering type particle size measuring apparatus.
(*2) Available from Nisshin Chemical Industries Co., Ltd.
(*3) Reactive polymer available from DAICEL-CYTEC COMPANY LTD.
(*4) Available from SAN NOPCO LTD.
(*5) Available from BASF Japan Ltd.

Comparative Compound 1 2-Hydroxyethyl Acrylate

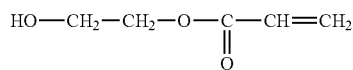

Comparative Compound 2 N-Acryloylmorpholine

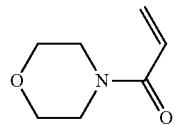

With respect to Exemplified Compounds 5, 7 and 8 and Comparative Compounds 1 and 2, commercially available products were used as they are. Exemplified Compound 6 was synthesized according to the following process. Specifically, after ethylene oxide was added to diglycerol by an addition reaction, epichlorohydrin was further reacted to obtain a derivative of glycidyl ether. Thereafter, acrylic acid was added to the resultant derivative by an addition reaction to obtain Exemplified compound 6. In addition, Exemplified Compound A was obtained by conducting synthesis according to the process described in Synthesis Example 1 of Japanese Patent Application Laid-Open No. 2005-307199.

Evaluation of Film Properties

Each of the liquid compositions having the respective compositions shown in Tables 1-1 to 1-5 was used to evaluate its film properties in the following manner. First, each of the liquid compositions was ejected on a commercially available PET (polyethylene terephthalate) film from a recording head by means of BJF 9000 (manufactured by Canon Inc.) so as to give a coating amount of 10 g/m². Then, the thus-coated PET film was immediately subjected to an ultraviolet (UV) irradiation apparatus. At this time, an UV curability evaluation apparatus, Model LH6B (manufactured by FUSION UV Systems Inc.) was used as an electrodeless UV lamp using microwaves. The irradiation intensity was 5,000 mW/cm², and the conveying speed was 0.4 m/sec. In order to show the film properties of the film thus formed, the 20° glossiness was measured. In the present invention, the higher 20° glossiness indicates that a more uniform film is formed. The pencil hardness of the film was measured by means of a commercially available pencil hardness tester. These measured results are shown in Table 2. Incidentally, the pencil hardness test was conducted according to the JIS standard. The higher pencil hardness in Table 2 indicates that a stronger film is formed.

Evaluation of Long-Term Storage Stability of Liquid Composition

Each of the liquid compositions of Examples 1 to 18 and Comparative Examples 1 to 9 was placed in a closed container made of a fluororesin and stored for a month at 60° C. Conditions (viscosity and average particle size of pigment) of the liquid composition before and after the storage were compared to conduct evaluation according to the following criteria. The evaluation results are shown in Table 2.

A: The conditions were not changed from the initial conditions even after the storage;

B: The viscosity and/or the average particle size was changed after the storage.

TABLE 2

| | Evaluation results | | |
|---|---|---|---|
| | Film properties | | Long-term storage stability |
| | Film-forming ability (20° glossiness) | Pencil hardness | |
| Example 1 | 40 | 3H | A |
| Example 2 | 35 | 2H | A |
| Example 3 | 35 | HB | A |
| Example 4 | 40 | 2H | A |
| Example 5 | 35 | H | A |
| Example 6 | 35 | HB | A |
| Example 7 | 35 | 4H | A |
| Example 8 | 30 | 3H | A |
| Example 9 | 20 | 3H | A |
| Example 10 | 40 | H | A |
| Example 11 | 40 | F | A |
| Example 12 | 45 | HB | A |
| Example 13 | 43 | HB | A |
| Example 14 | 45 | H | A |
| Example 15 | 35 | 2H | A |
| Example 16 | 40 | 2H | A |
| Example 17 | 15 | 3H | A |
| Example 18 | 40 | 4H | A |
| Comparative Example 1 | 30 | 2B | B |
| Comparative Example 2 | 30 | 2B | B |
| Comparative Example 3 | (*6) | 4B or less | B |

TABLE 2-continued

| | Evaluation results | | |
|---|---|---|---|
| | Film properties | | Long-term |
| | Film-forming ability (20° glossiness) | Pencil hardness | storage stability |
| Comparative Example 4 | 40 | 4B or less | A |
| Comparative Example 5 | 30 | 3B | B |
| Comparative Example 6 | 30 | 2B | B |
| Comparative Example 7 | (*6) | 4B or less | B |
| Comparative Example 8 | 40 | 4B or less | A |
| Comparative Example 9 | 10 | 2B | A |

(*6) No film was formed under the preparation conditions described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-250939, filed Oct. 30, 2009, which is hereby incorporated by reference herein in its entirety.

What is claimed is:

1. An ink jet recording method comprising:
ejecting a liquid composition on a recording medium, the liquid composition comprising (a) a water-soluble monomer, (b) a photopolymerization initiator, (c) an aqueous medium, (d) a polymer emulsion, and (e) a coloring material that is different from the polymer emulsion,
wherein the water-soluble monomer has two or more ethylenically unsaturated bonds, and
wherein the water-soluble monomer is curable with an active energy ray.

2. The ink jet recording method according to claim 1, wherein the water-soluble monomer has a molecular structure satisfying the relationship of the following expression (1):

$$3.5 \leq \text{(Molecular weight of water-soluble monomer)}/(28.05 \times \text{(Number of unsaturated double bonds in molecular structure)}) \leq 8.0. \quad \text{Expression (1)}$$

3. The ink jet recording method according to claim 1, wherein the water-soluble monomer has at least one hydroxyl group.

4. The ink jet recording method according to claim 1, wherein the photopolymerization initiator is a water-soluble acylphosphine oxide compound.

5. The ink jet recording method according to claim 1, wherein the polymer emulsion is a water-insoluble polymer present in a state of an emulsion in the liquid composition.

6. The ink jet recording method according to claim 1, wherein the water-soluble monomer is at least one selected from the group consisting of the following Exemplified Compounds 1 to 9, Exemplified Compound 1

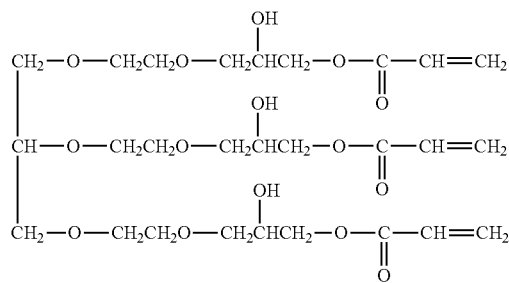

Exemplified Compound 2

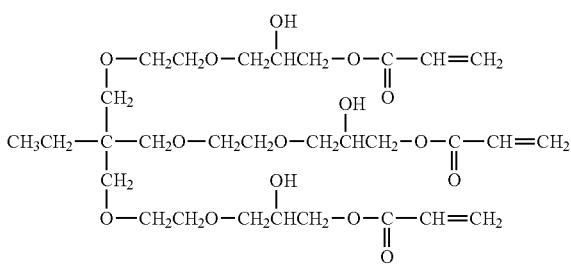

Exemplified Compound 3

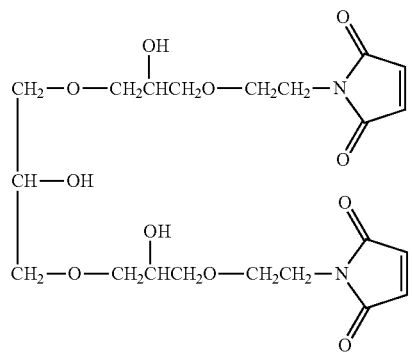

Exemplified Compound 4

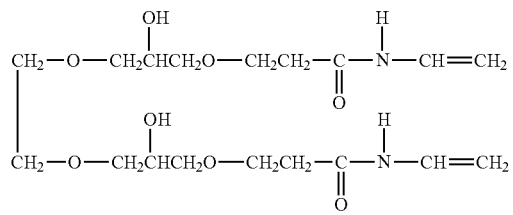

Exemplified Compound 5

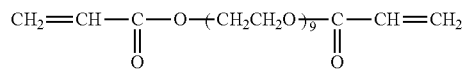

Exemplified Compound 6

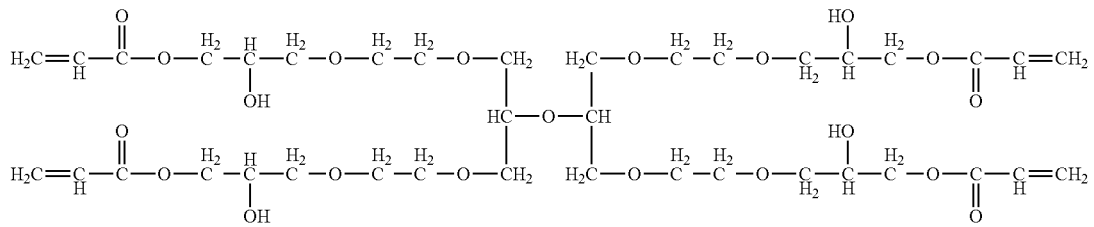 [SMILES: C=CC(=O)OCC(O)COCCOCC(COCCOCC(O)COC(=O)C=C)OC(COCCOCC(O)COC(=O)C=C)COCCOCC(O)COC(=O)C=C]

Exemplified Compound 7

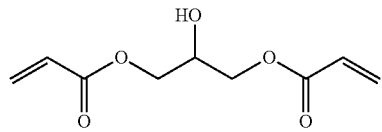

Exemplified Compound 8

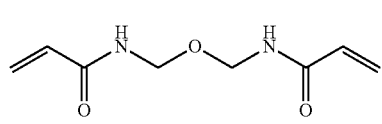

Exemplified Compound 9

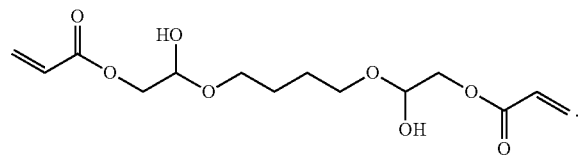 [SMILES: C=CC(=O)OCC(O)OCCCCOC(O)COC(=O)C=C ; "."]

7. The ink jet recording method according to claim 1, further comprising irradiating the recording medium on which the liquid composition has been ejected with an active energy ray to cure the water-soluble monomer.

8. The ink jet recording method according to claim 7, wherein the active energy ray is an ultraviolet ray.

9. The ink jet recording method according to claim 1, wherein the polymer emulsion comprises a vinyl chloride-acrylic ester copolymer,
wherein the water-soluble monomer is the following Exemplified Compound 7, and
wherein the photopolymerization initiator is the following Exemplified Compound A, Exemplified Compound 7

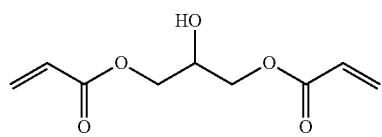

Exemplified Compound A

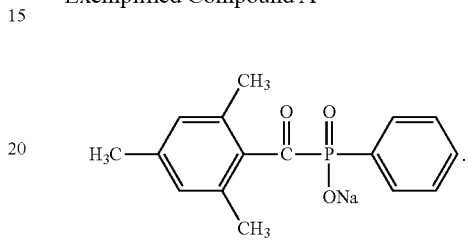

10. The ink jet recording method according to claim 1, wherein the photopolymerization initiator is at least one selected from the group consisting of the compounds represented by the following General Formulae (1), (3), (4), and (5), General Formula (1)

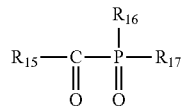

General Formula (3)

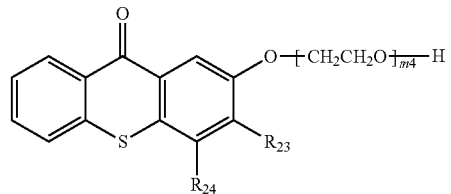

General Formula (4)

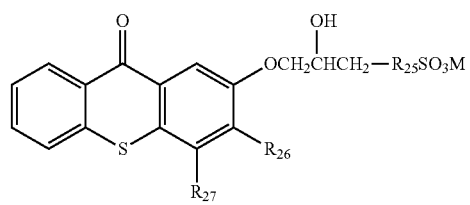

General Formula (5)
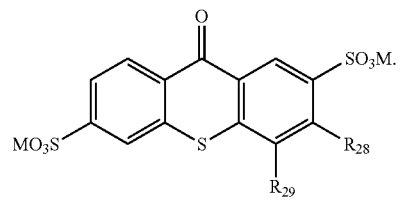
* * * * *